United States Patent
Lesso

(10) Patent No.: US 10,714,109 B2
(45) Date of Patent: Jul. 14, 2020

(54) METHODS AND APPARATUS FOR BUFFERING AND COMPRESSION OF DATA

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 87 days.

(21) Appl. No.: 15/938,809

(22) Filed: Mar. 28, 2018

(65) Prior Publication Data

US 2018/0286420 A1  Oct. 4, 2018

Related U.S. Application Data

(60) Provisional application No. 62/479,727, filed on Mar. 31, 2017.

(30) Foreign Application Priority Data

Oct. 11, 2017  (GB) .................................. 1716663.8

(51) Int. Cl.
| | | |
|---|---|---|
| *G10L 19/16* | (2013.01) | |
| *G10L 19/002* | (2013.01) | |
| *G10L 19/24* | (2013.01) | |
| *H03M 7/30* | (2006.01) | |
| *G10L 19/22* | (2013.01) | |

(52) U.S. Cl.
CPC .......... *G10L 19/167* (2013.01); *G10L 19/002* (2013.01); *G10L 19/24* (2013.01); *H03M 7/30* (2013.01); *H03M 7/3079* (2013.01); *H03M 7/6023* (2013.01); *H03M 7/6064* (2013.01); *H03M 7/6082* (2013.01); *G10L 19/22* (2013.01)

(58) Field of Classification Search
CPC ...... G10L 19/167; G10L 19/002; G10L 19/24
See application file for complete search history.

(56) References Cited

U.S. PATENT DOCUMENTS

| | | | |
|---|---|---|---|
| 6,084,910 A | 7/2000 | Stanger et al. | |
| 7,394,410 B1 | 7/2008 | Wegener | |
| 7,809,559 B2 * | 10/2010 | Kushner | A62B 18/08 375/343 |

(Continued)

FOREIGN PATENT DOCUMENTS

| | | |
|---|---|---|
| JP | 2009145919 A | 7/2009 |
| WO | 95/02301 A | 1/1995 |
| WO | 2016186563 A1 | 11/2016 |

OTHER PUBLICATIONS

International Search Report and Written Opinion of the International Searching Authority, International Application No. PCT/GB2018/050835, dated May 24, 2018.

(Continued)

*Primary Examiner* — Bryan S Blankenagel
(74) *Attorney, Agent, or Firm* — Jackson Walker L.L.P.

(57) ABSTRACT

One aspect of the disclosure provides a device, comprising: an allocation module, for determining one or more metrics of each of a plurality of data streams; a compression module, for compressing each of the plurality of data streams and generating a plurality of compressed data streams, the compression module applying a compression ratio that varies as a function of the metrics determined by the allocation module; and a buffer memory, for storing the plurality of compressed data streams.

23 Claims, 8 Drawing Sheets

(56) References Cited

U.S. PATENT DOCUMENTS

| | | | |
|---|---|---|---|
| 8,587,600 B1* | 11/2013 | Tischler | G09G 5/363 |
| | | | 345/537 |
| 2003/0035315 A1* | 2/2003 | Kozicki | G11C 11/34 |
| | | | 365/171 |
| 2003/0206558 A1 | 11/2003 | Parkkinen et al. | |
| 2004/0109435 A1* | 6/2004 | Alasti | H04L 1/0006 |
| | | | 370/350 |
| 2004/0154041 A1 | 8/2004 | Zhang | |
| 2009/0073006 A1 | 3/2009 | Wegener | |
| 2015/0317995 A1* | 11/2015 | De Vries | G10L 19/265 |
| | | | 704/206 |
| 2017/0043162 A1* | 2/2017 | Lopez-Poveda | A61N 1/36032 |
| 2017/0242806 A1* | 8/2017 | Solbach | G06F 3/061 |

OTHER PUBLICATIONS

Combined Search and Examination Report, UKIPO, Application No. GB1716663.8, dated Apr. 11, 2018.
International Search Report and Written Opinion of the International Searching Authority, International Application No. PCT/GB2018/050835, dated Jul. 16, 2018.

* cited by examiner

METHODS AND APPARATUS FOR BUFFERING AND COMPRESSION OF DATA

TECHNICAL FIELD

Examples of the present disclosure relate to methods and apparatus for buffering and compression of input data, and particularly relate to methods and apparatus for buffering and compression of data received from a plurality of sensors, such as a plurality of microphones.

BACKGROUND

Sensor devices create streams of data to be processed by electronic circuitry. In order to capture those data streams, it is common to store incoming data temporarily in a buffer before providing it to other components for processing or long-term storage.

For example, GB patent application no. 1322349.0 (publication no 2523984) discloses an automatic speech recognition system to, for example, wake up a mobile phone in response to detection of a trigger phrase being uttered by a user. A microphone generates an audio signal and this, together with a suitable sampling mechanism, is used to generate a stream of discrete audio data samples. The sampling mechanism may be provided within the microphone or in the speech recognition system itself. Prior to its processing by the system, the audio data is temporarily stored in a data buffer. The data buffer takes the form of a circular buffer, which is an area of memory to which data is written, with the oldest data being overwritten when the memory is full.

Most modern integrated circuits are generally required to be as area-efficient and low-power as possible, within the constraints of the design parameters defined for the circuit in question. Buffer memories may occupy a significant portion of the available area, and in such a situation it would therefore be desirable to reduce the amount of memory required for correct functioning of the integrated circuit, and/or to ensure that area allocated for memory is utilized efficiently.

SUMMARY

According to one aspect of the disclosure, there is provided a device, comprising: an allocation module, for determining one or more metrics of each of a plurality of data streams; a compression module, for compressing each of the plurality of data streams and generating a plurality of compressed data streams, the compression module applying a compression ratio that varies as a function of the metrics determined by the allocation module; and a buffer memory, for storing the plurality of compressed data streams.

In another aspect, there is provided a device, comprising: a plurality of inputs, for receiving one or more data signals from a plurality of sensors; an allocation module, for determining a number of received data signals; a compression module, for compressing data streams corresponding to each of the received data signals and generating one or more compressed data streams, the compression module applying a compression ratio that varies as a function of the number of received data signals; and a buffer memory, for storing the one or more compressed data streams.

In a further aspect, there is provided a device, comprising: a compression ratio module, for determining respective compression ratios to be applied to each of a plurality of data streams, said compression ratios being based upon one or more metrics of each of the plurality of data streams; and a compression module coupled to said compression ratio module for compressing each of the plurality of data streams according to the determined compression ratios.

In another aspect, there is provided a device, comprising: a compression module, for compressing each of a plurality of data streams to produce respective compressed data streams, wherein a respective compression ratio applied by the compression module between each of the plurality of data streams and the corresponding compressed data streams varies as a function of a metric of the respective data stream.

A further aspect provides a device, comprising: an allocation module, for determining one or more metrics of each of a plurality of data streams; a compression module, for compressing each of the plurality of data streams to produce respective compressed data streams, a respective compression ratio applied by the compression module between each of the plurality of data streams and the corresponding compressed data streams varies as a function of the determined metrics; and a buffer, for storing the plurality of compressed data streams.

Another aspect provides a device, comprising: means for determining at least one characteristic of each of a plurality of data streams; means for compressing each of the plurality of data streams, wherein a respective compression ratio applied to said data streams varies as a function of the at least one characteristic of each of a plurality of data streams.

A yet further aspect provides a device, comprising: a compression module for compressing each of a plurality of data streams and generating corresponding compressed data streams wherein a respective compression ratio applied to each of the plurality of data streams varies as a function of a characteristic of the respective data stream.

Another aspect of the disclosure provides a device, comprising: an allocation module, for determining one or more metrics of each of one or more data streams; and a buffer memory, for storing the one or more data streams. The allocation module is configured to control a power level provided to the buffer memory as a function of the one or more metrics.

For example, in one embodiment, the power level may be controlled such that a power level provided to the buffer memory is equal to a first power value responsive to a determination that the one or more metrics are equal to a first metric value, and such that the power level provided to the buffer memory is equal to a second power value responsive to a determination that the one or more metrics are equal to a second metric value, wherein the second metric value is lower than the first metric value, and wherein the second power value is lower than the first power value.

In one embodiment, the power level may be adjusted based on a particular metric value for that portion of the buffer memory storing the data stream associated with the particular metric value. If more than one data stream is received, the portions of the buffer memory may be provided with respective power levels associated with the metrics for the respective data streams.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Figure 1:
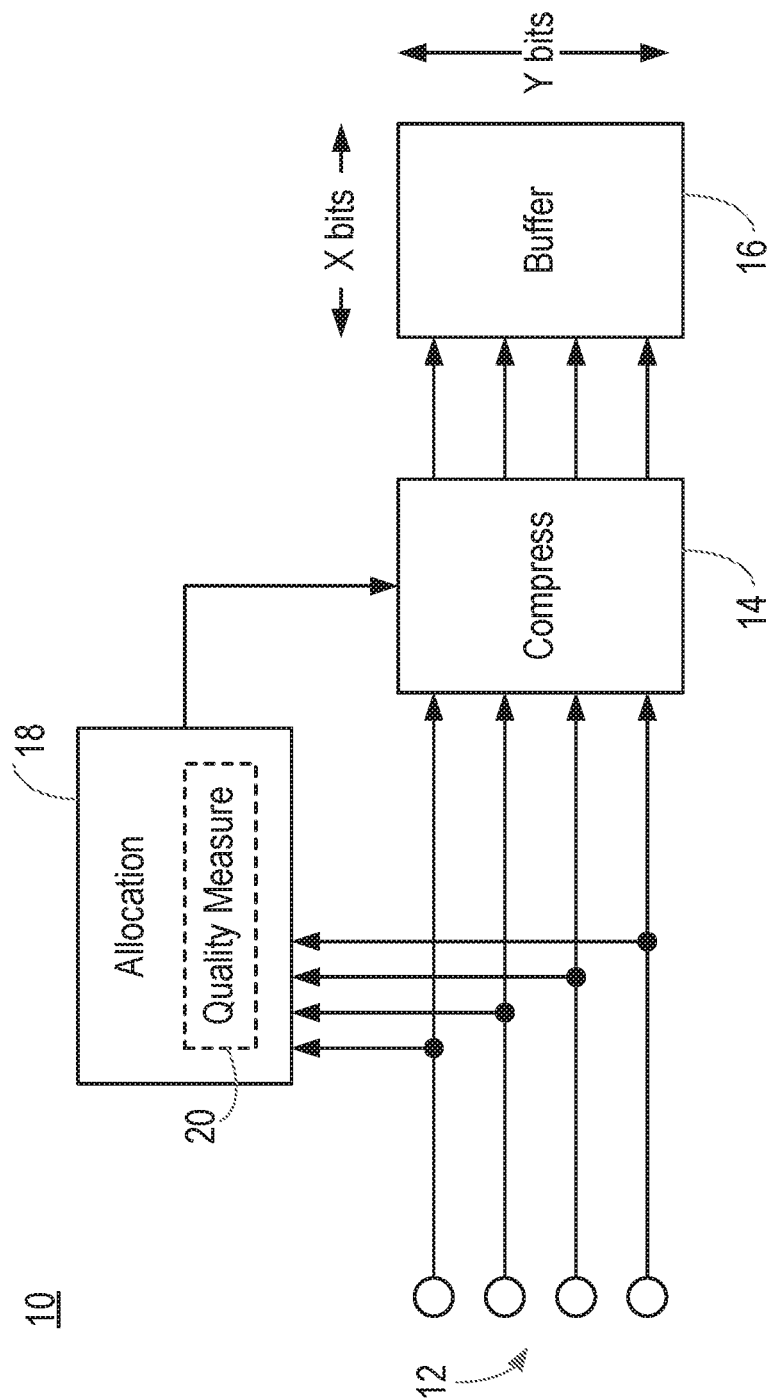
FIG. 1 shows an example of a device according to embodiments of the invention.

FIG. 1 is a schematic diagram of a device 10 according to embodiments of the invention.

The device 10 comprises a plurality of inputs 12, each of which receives data from a corresponding sensor (not illustrated). The respective data may be in the form of a data stream. Each of the data streams is compressed by a compression module 14, before being stored, i.e. buffered, in memory 16. Prior to their compression, each data stream is also provided to an allocation module 18, which may comprise a quality measure module 20. The allocation module 18 may provide one or more control signals (CTL) to the compression module 14, on the basis of one or more metrics or characteristics of the data streams, to control the way in which the data streams are processed by the compression module 14.

Prior to its compression and subsequent storage in the buffer memory 16, the data is converted into the digital domain. Typically, each of the sensors will acquire, at least initially, one or more analogue signals representing one or more sensed parameters. These analogue signals are sampled at a defined sampling frequency in order to produce a series of discrete values, each representing the value of the analogue signal at a particular instance in time. The discrete values are also quantized to a defined accuracy, or a number of bits. This analogue-to-digital conversion may take place in the sensors themselves, in circuitry coupled between the sensors and the device 10, or in the device 10 itself. In the former two cases, the inputs 12 thus receive data streams comprising digital data, i.e. data that has been sampled at a defined frequency and quantized to a defined number of bits. In the latter case, the inputs 12 receive data comprising analogue data, and the device 10 additionally requires analogue-to-digital conversion (ADC) circuitry (not illustrated) to convert those analogue signals to the digital domain. Such ADC circuitry may be coupled into the signal path after each of the inputs 12, but prior to the nodes at which the data streams are passed to the allocation module 18. Embodiments of the invention are not limited to any particular case, and therefore the inputs 12 may receive digital data, or analogue signals (from which digital data is produced by ADC circuitry). In the following, the term "data signal" is taken to mean an electronic signal representing data, whether in the analogue or digital domain. The term "data stream" is taken to refer to a train, i.e. a sequence, of discrete, digital data values.

The illustrated embodiment shows four inputs 12, with each input receiving a single data signal from a corresponding sensor; however, it will be appreciated that any number of inputs greater than one may be provided, and that more than one data signal may be multiplexed on to a single input. The disclosure is not limited in this respect. However, in the simplest embodiment a single input is provided for a single data signal from a single sensor, with the device comprising multiple such inputs 12.

The compression module 14 will be described in greater detail below (see in particular FIGS. 3a and 3b). However, in general it applies one or more compression algorithms to each of the data streams to generate corresponding compressed data streams. The compressed data streams are then stored in the buffer 16, and relatively more data can be stored in the buffer than would have been the case if the data streams had not been compressed.

Each data stream may be compressed according to a compression ratio, which is the ratio of the uncompressed data size to the compressed data size. For example, compression of a data signal from 24 bits to 12 bits implies a compression ratio of 2. Compression of a data signal from 24 bits to 8 bits implies a compression ratio of 3, and so on. A relatively higher compression ratio therefore means that the data is compressed to a relatively greater extent.

Data that has been compressed with a higher compression ratio may be associated with greater processing complexity to decompress the data, and/or a greater loss of data as part of the compression process. That is, the more compressed a data stream is, the more effort is required to decompress that data. Also, the more compressed a data stream is, the greater the likelihood that data will be lost as part of the compression/decompression process (assuming the application of a lossy compression algorithm in the compression module 12). In either case, therefore, there is an overhead associated with compressing data.

According to embodiments of the invention, the compression module 14 applies a compression ratio to each of the data streams that varies as a function of one or more metrics or characteristics of the data streams. It should be noted that the one or more metrics or characteristics may relate to single data streams, i.e. a self-contained metric or characteristic for a particular data stream. Alternatively, the one or more metrics or characteristics may relate to two or more data streams, wherein like metrics or characteristics are compared to one another, i.e. a comparison metric or characteristic.

Note that the variation of compression ratio as a function of the one or more metrics may be different according to different embodiments of the invention. For example, data that is relatively more important may be compressed using a relatively lower compression ratio than data that is relatively less important. The reason behind this is that important data should be relatively easy to access (i.e. require relatively little effort to decompress). Unimportant data can be relatively harder to access (i.e. require more effort to decompress) as it is expected that the data will be required less often, or with less urgency.

In other embodiments, the compression ratio may vary as a function of the quality of the data and the nature of the compression algorithm that is applied in the compression module 14. For example, if a lossy compression algorithm is applied to one or more of the data streams in the compression module 14, a higher compression ratio may be associated with a greater loss of data. In this case, relatively high-quality data may be compressed using a relatively lower compression ratio than relatively low-quality data. The reason behind this is that the quality of the high-quality data should be maintained as far as possible so as to acquire at least one high-quality set of sensor measurements. If the quality of the data is already low, then a lossy compression algorithm with a relatively high compression ratio, i.e. that loses data as part of the compression process, can be accepted.

In further embodiments, different strategies might be enabled in different use cases.

For example, in one strategy, data that has relatively high quality (or high values for other similar metrics or characteristics) may be compressed according to a compression ratio that is relatively low; data that has relatively low quality (or low values for other similar metrics) may be compressed according to a compression ratio that is relatively high. This strategy corresponds to the one outlined above, in which high-quality data is maintained as far as possible, while lower-quality data is less important. This strategy may be suitable in use cases where it is expected that the data from one input may be of significantly higher quality than the data from other inputs. For example, when implemented in a mobile phone, a dedicated voice microphone might be expected to acquire higher-quality voice data than other microphones, such as those positioned to acquire ambient noise for an active noise cancellation system for example.

In another strategy, however, it may be desired to equalize the quality of data from each input. According to such a strategy, relatively high-quality data may be compressed according to a compression ratio that is relatively high, while relatively low-quality data may be compressed according to a compression ratio that is relatively low. For example, more bits of the buffer memory 16 may be dedicated to a low-quality input than to a high-quality input. In this way, the quality of each signal (i.e. after de-compression) can be equalized. This strategy may be suitable in use cases where it is expected that the data from each input is equally important. For example, the signals from each microphone of a multiple microphone active noise cancellation system might be considered equally important, regardless of the quality of any one microphone input.

If a lossless compression algorithm is applied to one or more of the data streams in the compression module 14, then a different variation of the compression ratios may be considered. For example, in this case the compression ratios may vary as a function of the importance of the data streams and not the quality of the data streams (as data is not lost as part of the compression/decompression process).

By intelligently varying the compression ratio that is applied to each data stream, the available space in the buffer memory 16 can therefore be used more efficiently (and/or the amount of space dedicated to the buffer memory 16 can be reduced).

The utility of the allocation module 18 will now be clear. The allocation module 18 receives each of the plurality of data streams and determines one or more metrics of those data streams (i.e. the allocation module determines at least one characteristic of each data stream). On the basis of the determined metrics, the allocation module 18 generates one or more control signals CTL defining explicitly or implicitly appropriate compression ratios for each of the data streams, and outputs the one or more control signals CTL to the compression module 14. The one or more control signals CTL may define an individual compression ratio for each data stream, or may define one or more compression ratios that apply to multiple data streams. In defining the compression ratio explicitly, the control signal(s) CTL may contain an indication of the particular compression ratio that is to be applied. In defining the compression ratio implicitly, the control signal(s) CTL may contain an indication of the number of bits that the compressed data stream is to occupy (which, together with the number of bits of the uncompressed data stream, implies a particular compression ratio). The present invention is not limited to either embodiment. Upon receipt of the one or more control signals CTL, the compression module 14 is then able to apply the required compression ratio to each data stream.

The allocation module 18 may comprise a quality measure module 20 for determining the one or more metrics of the data streams.

Example metrics or characteristics include
Activity (e.g. is the input enabled and/or have any input?)
Amplitude (e.g. what is the largest signal)
Bandwidth of input (how much bandwidth do the inputs use?)
Signal-to-noise ratio (SNR)
Sparsity
Importance (e.g. a heart rate monitor may be of more importance than a sensor for measuring ambient temperature),
Sampling Frequency
Dominant Frequency For example, in one embodiment, the quality measure module 20 determines a quality of each of the received data streams.

In another embodiment, the quality measure module 20 determines the power levels present in each of the received data streams. For example, the inputs may be used to capture both signal and noise inputs for downstream processing.

In a further embodiment, the quality measure module 20 determines whether the sensor for a particular data stream is activated or deactivated, i.e. whether the data stream is present or not, or indeed if a sensor is in fact connected to an input 12. For example, in some modes of operation the sensors may be deactivated and not outputting any data or not present. The absence of one or more of the data signals or sensors can then be taken into account when determining the compression ratios to be applied to each of the data streams corresponding to data signals that have been received over the inputs 12. In this case if any inputs are disabled or have zero signal then no bits should be allocated to them.

The compression module 14, allocation module 18 and quality measure module 20 may be implemented, for example, in one or more digital signal processors (DSPs).

Figure 7:
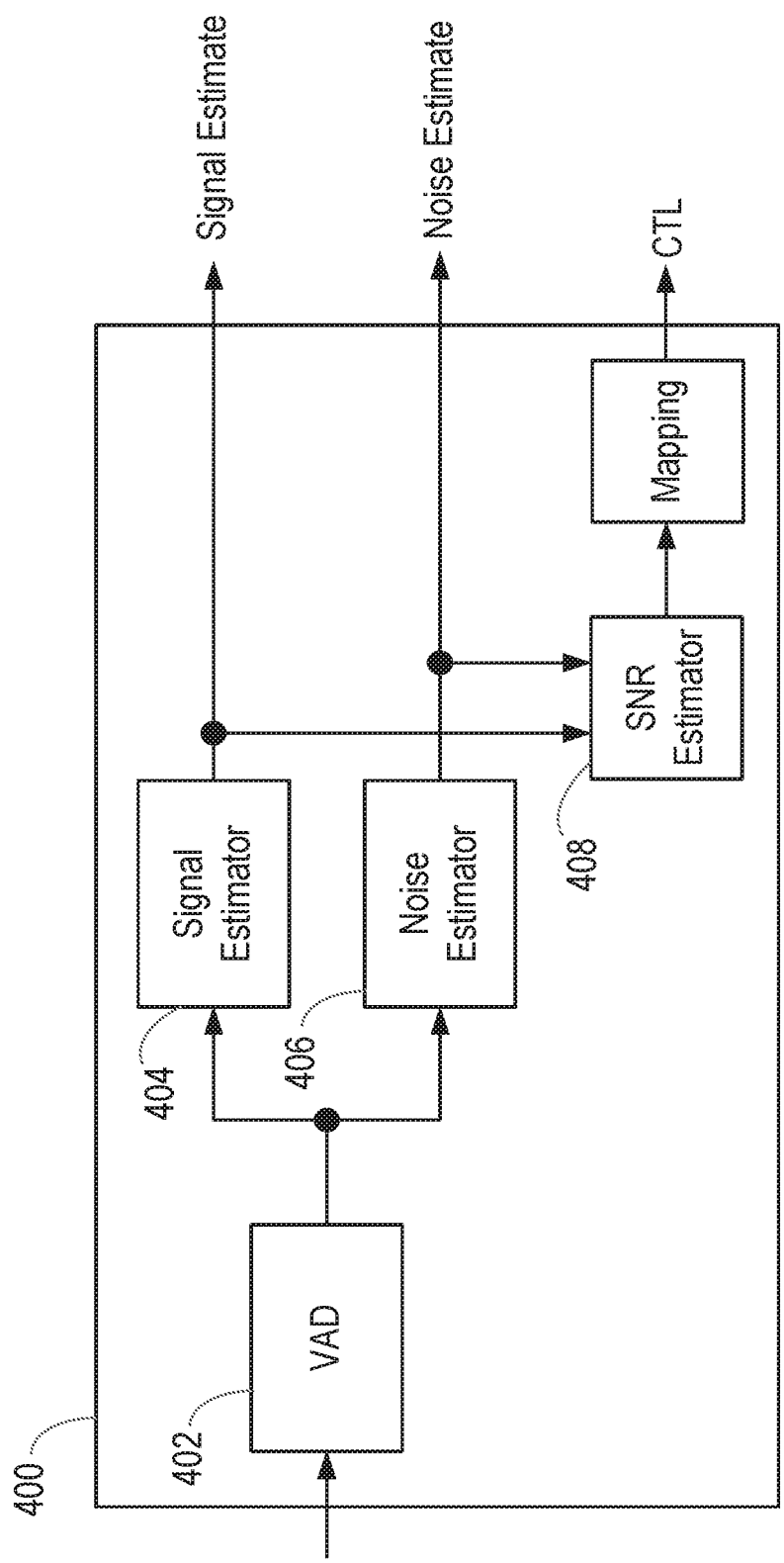
FIG. 7 shows an allocation module according to embodiments of the invention.

FIG. 7 shows an allocation module 400 according to one embodiment. The allocation module 400 may be suitable for use as the allocation module 18 shown in FIG. 1.

The module 400 comprises a voice activity detector (VAD) 402 which receives data from a plurality of microphone inputs and detects the presence of a voice in the incoming data.

Upon detection of a voice, the signal is passed to a signal estimator 404 and a noise estimator 406, which serve to estimate the signal and noise in the incoming data respectively. These signal and noise estimates may be output from the allocation module 400 for use in other modules of a host device. In addition, they may both be passed to an SNR estimator 408, which determines the SNR based on the signal and noise estimates. In the illustrated embodiment, the SNR estimate is passed to a mapping module 410, which maps the SNR estimate to an appropriate control signal CTL for the compression module. In alternative embodiments, however, the SNR estimate may be output directly and used by the compression module to determine an appropriate compression ratio. Here the quality metric is the SNR per microphone input therefore.

Figure 2:
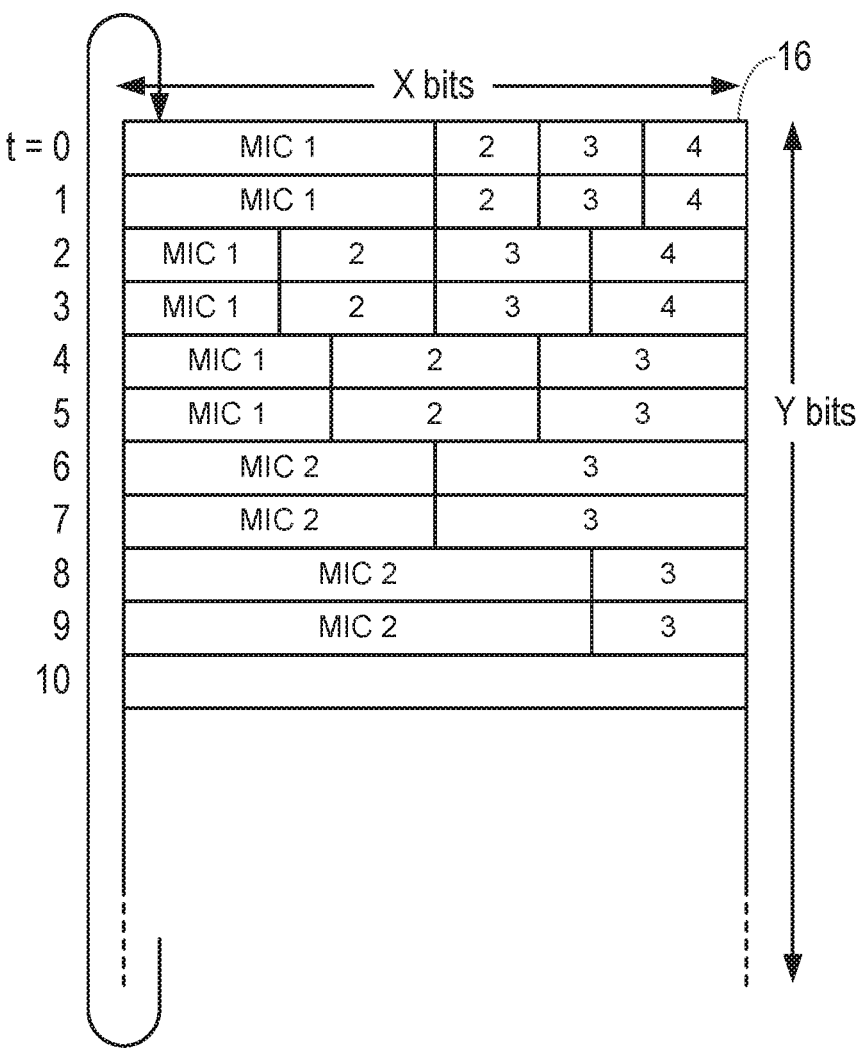
FIG. 2 shows an example of a buffer memory according to embodiments of the invention.

FIG. 2 shows the buffer memory 16 according to embodiments of the invention in more detail.

In the illustrated embodiment, the buffer 16 is X bits wide and Y bits long, where X and Y are integers greater than one. In different embodiments, X may be 8, 12, 24, 48 or any other suitable number. In one embodiment, X may be set equal to the number of bits in each of the uncompressed data streams. That is, if each data stream contained samples having 24 bits, then X may be set equal to 24. Y can be any number and may be defined by the designer in accordance with the requirements of the device 10. The buffer 16 may therefore be thought of as Y rows, with each row comprising X bits. Note that this does not necessarily imply that each of the X bits in a row is at a neighbouring physical address in memory, nor that each of the Y rows neighbour each other in the memory. However, in one embodiment the X bits in each row are at a neighbouring physical address in memory, and the Y rows do neighbour each other in the memory.

In one embodiment, the buffer 16 is circular and this is illustrated in FIG. 2 by the presence of an arrow extending from the final row back to the first row. Circular buffers are characterized by the overwriting of the oldest data once the memory is full. Thus, once the final row of the buffer memory 16 has been written to, and the memory is full, further data is written over the data contained in the first row, and so on. The buffer therefore reaches a "wrap point" at which the write address pointers revert to the start of the buffer.

FIG. 2 illustrates various examples of the compressed data that might be stored in the buffer memory 16.

It will be understood by those skilled in the art that each of the data streams comprises a train, i.e. a sequence, of digitized sensor values, each sensor value comprising a certain number of bits and corresponding to a particular instance in time. In one embodiment, the compression ratios for each of the data streams are configured such that the compressed data streams together occupy X bits per time sample. In this way, each of the rows of the buffer memory 16 correspond to data from a single instance in time. Further, use of the buffer memory 16 is maximized as each row is completely occupied, i.e. there are no unpopulated memory addresses. As an extension of this idea, those skilled in the art will appreciate that in alternative embodiments the compression ratios for each of the data streams may be configured such that the compressed data streams together occupy nX bits per time sample, where n is an integer equal to one or more. Again, this embodiment has the advantages that each row is completely occupied and corresponds to data acquired at a single instance in time (albeit that one or more other rows may also contain data acquired at that instance in time).

In the illustrated embodiment, each of the rows of the buffer memory corresponds to a single, different instance in time, with the first row containing data corresponding to time equal to 0, the second row containing data corresponding to time equal to 1, and so on. It will also be apparent in the illustrated embodiment that the compression ratios applied to each of the data streams are updated every other sample. That is, the same compression ratios are applied to the data streams for two samples before being updated as required by the changing metrics determined by the allocation module 18. In other embodiments it may be practical to update the compression ratios at a lower frequency than that, e.g. only once for every complete run through of the buffer memory 16. In that embodiment the wrap point of the buffer 16 may be chosen as a convenient point at which to update the compression ratios. In still further embodiments, of course, the compression ratios may be updated for every sample of the data streams.

In the examples shown in FIG. 2, the sensors are microphones and the data streams comprise audio data. Of course, other sensors and corresponding data types are possible without departing from the scope of the invention defined in the claims appended hereto.

At time 0, all four microphones MIC1-MIC4 are active and thus four data streams DS1-DS4 are received over the inputs 12. The allocation module 18 receives each of the data streams DS1-DS4 and is able to determine that the data stream DS1 origination from MIC1 has the highest quality or is the most important. Accordingly, MIC1 is allocated the largest share of the buffer memory 16 (corresponding to the lowest compression ratio), i.e. the greater number of X bits. In the example, MIC1 is allocated half of the available X bits. The data streams DS2-DS4 originating from the other three microphones MIC2-MIC4 have relatively lower quality and/or importance and therefore these data streams are allocated relatively less of the buffer memory (corresponding to higher compression ratios). Each of these data streams is allocated one sixth of the available X bits. In embodiments where each of the samples of the uncompressed data streams has X bits, therefore, a compression ratio of 2 is applied to the data stream DS1 originating from MIC1, while a compression ratio of 6 is applied to each of the data streams DS2-DS4 originating from respective microphones MIC2-MIC4.

As the compression ratios are only updated every other sample period in this particular example, these compression ratios persist for the next sample period (i.e. they are stored in the next available row of the memory) corresponding to time (t) equal to 1.

At t=2, the data stream DS1 originating from MIC1 has a different metric or characteristic such as a reduction in quality or importance relative to the data streams DS2-DS4 originating from the other microphones MIC2-MIC4 (or the quality and/or importance of their respective data streams has improved), and the same compression ratio is allocated to all of the data streams DS1-DS4. This implies equal allocation of buffer memory space and therefore each data stream DS1-DS4 is allocated a quarter of the available X bits. In embodiments where each of the samples of uncompressed data has X bits, a compression ratio of 4 is applied to all four data streams DS1-DS4. These compression ratios persist when t=3.

At t=4, the data stream DS4 from MIC4 is lost. For example, MIC4 may have been deactivated temporarily, or developed a fault. The metrics from the remaining data streams DS1-DS3 remain at their previous values, and thus again this implies equal allocation of buffer memory space but only between the data streams DS1-DS3 that are present. Therefore each of the data streams DS1-DS3 from respective microphones MIC1-MIC3 is allocated a third of the available X bits. In embodiments where each of the samples of uncompressed data has X bits, a compression ratio of 3 is applied to each of those three data streams. These compression ratios persist when t=5.

At t=6, the data stream DS1 from MIC1 is lost. Again, this may be because MIC1 was deactivated, developed a fault, or for any other reason. The data stream DS4 from MIC4 remains absent. The metrics from the remaining data streams DS2-DS3 from respective microphones MIC2-MIC3 remain at their previous values, and thus each is allocated half of the available X bits. In embodiments where each of the samples of uncompressed data has X bits, a compression ratio of 2 is applied to each of those data streams. These compression ratios persist when t=7.

At t=8, the quality and/or importance of the data stream DS2 from MIC2 increases relative to the data stream DS3 from MIC3 (or, similarly, the quality and/or importance of the data stream DS3 from MIC3 falls relative to the data stream DS2 from MIC2). For example, the signal from MIC3 may have fallen in quality owing to a nearby object occluding the microphone. The data streams DS1 and DS4 from MIC1 and –MIC4 remain absent. Therefore the data stream DS2 from MIC2 is allocated a relatively larger share of the available X bits. In the example, the data stream DS2 from MIC2 is allocated three-quarters of the available X bits while the data stream DS3 from MIC3 is allocated a quarter of the available X bits. In embodiments where each of the samples of uncompressed data has X bits, compression ratios of 4/3 and 4 are applied respectively. These compression ratios persist when t=9.

The buffer memory 16 continues to be written to in this way until it is full (i.e. it reaches its wrap point), at which point the data in the first row is overwritten.

Note that these compression ratios are given as examples only. In physical systems it is likely that the sampling frequency will be high, such that such significant variations of the metrics (and consequently the compression ratios) will not occur every other sample as indicated in FIG. 2.

Figure 3A:
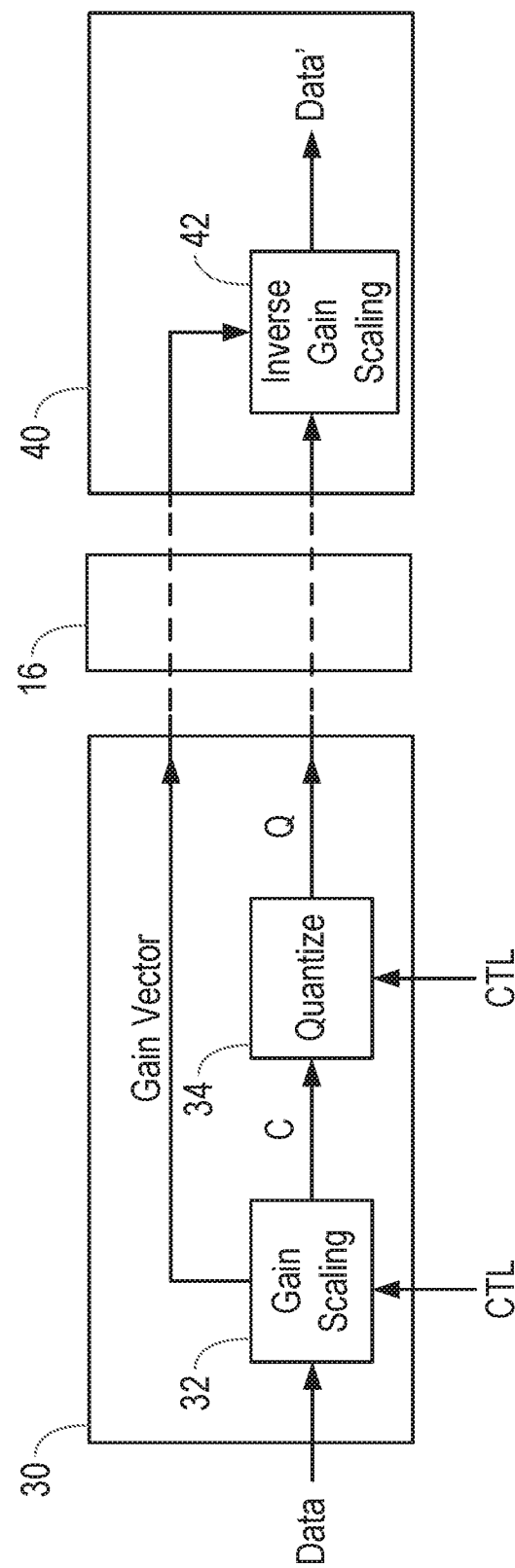
FIGS. 3a and 3b show compression modules according to embodiments of the invention.

FIG. 3a shows in more detail a compression module 30 according to embodiments of the invention. Also shown are the memory 16 and a decompression module 40 used to decompress the data stored in the memory 16. The compression module 30 may be suitable for use as the compression module 14 shown in FIG. 1.

The compression module 30 comprises a gain scaling module 32 and a quantization module 34. The gain scaling module 32 receives incoming data from the multiple inputs, calculates the appropriate gain to be applied to the data in order to maximize the signal prior to its quantization by the quantization module 34, and applies that gain to the incoming data. The gain may be calculated and applied on a sample-by-sample basis, such that each sample may be subject to a different value of gain. In other embodiments, the gain may be calculated and applied for a group of samples. The output of the gain scaling module 32 is a gain scaled signal that is representative of the incoming data and, after application of the gain, comprises C bits.

The quantization module 34 receives this gain scaled signal and quantizes it in order to reduce the number of bits to a value Q. In one embodiment, the quantization module 34 is implemented as a word length reduction (WLR) block, reducing the signal from C to Q bits by removing the (C–Q) least significant bits (LSBs). In other embodiments, alternative quantization algorithms may be applied.

One or more of the gain applied by the gain scaling block 32 and the level of quantization applied by the quantization block 34 may be controlled by the control signals CTL received from the allocation block 14. That is, both the gain and the quantization factor affect the compression ratio that is achieved by the compression module 30. Therefore the compression ratio may be controlled in dependence on the metric measured or determined by the allocation module 18 either by altering the gain, the quantization factor, or both.

The quantized data and the gain vector applied by the gain scaling module 32 are thus stored in memory 16. The data can be decompressed by a decompression module 40, which receives the quantized data and the gain vector. The decompression module 40 comprises an inverse gain scaling module 42, which inversely applies the gain vector to the quantized data in order to recover the data.

Figure 3B:
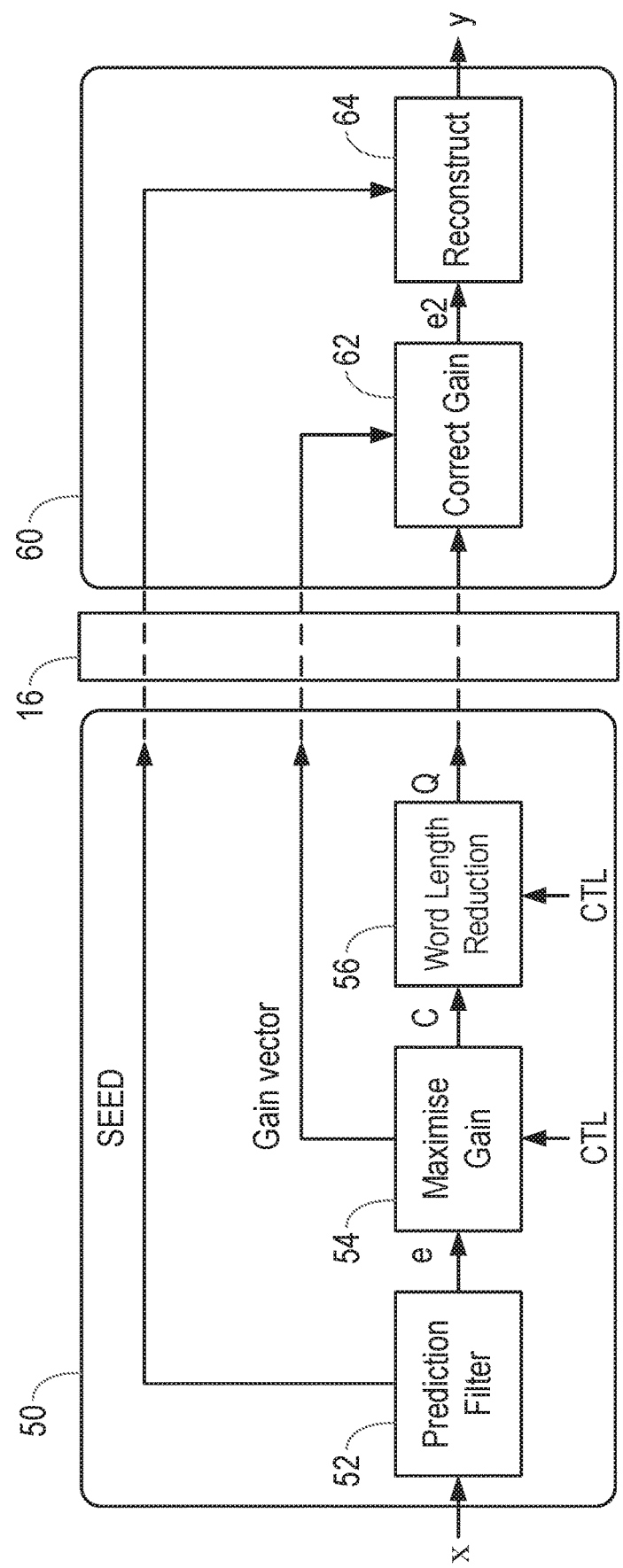

FIG. 3b shows a compression module 50 according to an alternative embodiment. Also shown are the memory 16 and a corresponding decompression module 60.

The compression module 50 comprises a gain block 54 and a quantization block 56 which carry out substantially similar operations as their respective counterparts 32 and 34 in FIG. 3a. That is, the gain block 54 calculates and applies the appropriate gain in order to maximize a certain signal prior to its quantization by the quantization block 56. The quantization block 56 receives the signal after gain has been applied, and reduces the number of bits to Q, through one or quantization algorithms (such as word length reduction).

The compression module 50 further comprises a prediction filter 52, which receives the incoming data x from the inputs and predicts the value of a current sample $\hat{x}(n)$ based on one or more previous samples. The output of the prediction filter 52 is the difference e between the predicted value and the actual value. This may be beneficial as the quantization (e.g. the word length reduction) then acts on a difference signal e that has a "whiter" spectrum than the incoming signal itself.

For example, a first-order prediction filter may estimate the value of a current sample $\hat{x}(n)$ by:

$$\hat{x}(n)=a*x(n-1)$$

where a is a constant. For some data types, such as speech and music, a may be close to 1. The output from the prediction filter 52 is a residue i.e. the difference between the predictor and the actual sample. The residual e is the output.

$$e(n)=\hat{x}(n)-x(n)$$

The residue e is passed to the gain scaling block 54, where gain is applied, and then quantized in module 56. The quantized residue Q, the gain vector, and the initial value of the incoming data (SEED) are then stored in the memory 16.

The decompression module 60 comprises an inverse gain scaling module 62 and a reconstruction module 64. The gain module 62 acquires the quantized residue Q and the gain vector from the memory 16, and recovers the residue e (denoted e2 in the Figure) by inversely applying the gain vector to the quantized residue. The reconstruction module 64 applies the same prediction algorithm to predict values of the data based on the SEED value, and adds the residue e2 to recover the actual signal y. For the first-order predictor, the code is as shown below.

$$y(0)=SEED=x(0)$$

$$\text{For } n>1, x(n)=\hat{x}(n)+e2(n)$$

$$\text{For } n>1, x(n)=a*x(n-1)+e2(n)$$

It should be noted that, in either embodiment discussed above with respect to FIGS. 3a and 3b, the quantized value Q may be passed through an arithmetic coder (such as a Rice code) to achieve further compression.

In an additional or alternative aspect, the device is configured to control the voltage power level provided to the buffer memory 16. In particular, when the allocation module 18 or the quality measure module 20 determines that a signal has a relatively reduced quality and/or importance level, the allocation module 18 may control a power supply provided to the buffer memory 16 to reduce the voltage supplied to the memory itself. Such a reduction in the supplied power to the buffer memory 16 can result in an increase in the error rate for data stored in the memory, but such an increased error rate can be acceptable in the case of data having a relatively reduced quality and/or importance level, while providing improved power saving performance for the overall device.

In one aspect, the power supply may be adjusted for that portion of the memory used to store the quantized value Q output by the quantization block 34.

It will be understood that the power level of the buffer memory 16 may be adjusted in parallel with an adjustment in the compression ratio of the data via compression module 14, or the power level may be adjusted as an alternative to adjustment of the compression ratio.

Figure 4:
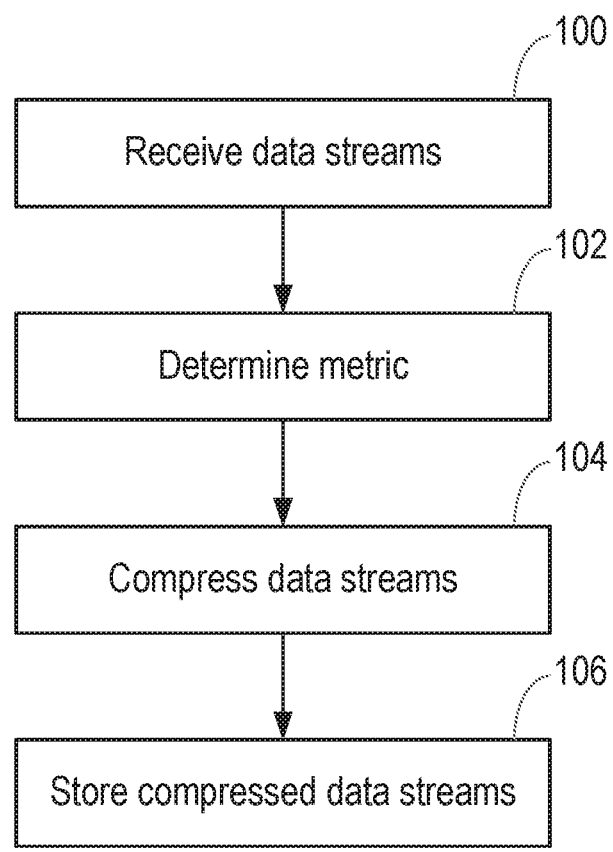
FIG. 4 is a flowchart of a method according to embodiments of the invention.

FIG. 4 is a flowchart of a method according to embodiments of the invention.

The method begins in step 100, in which one or more data signals are received on the plurality of inputs 12. As noted above, the data signals may be digital data streams, or analogue data signals (in which case they are converted to digital data streams in ADC circuitry). Further, it is apparent that data signals may not be received on all of the inputs 12, for example, if one or more of the sensors (e.g. microphones) is deactivated or develops a fault. Therefore one or more data signals are received on the plurality of inputs 12. If all of the sensors are active, the data signals may be received on all of the inputs 12.

In step 102, the allocation module 18 and its associated quality measure module 20 determines one or more metrics of each of the data streams. The metrics or characteristics may be any as listed above.

In step 104, the compression module 14 compresses each of the data streams to produce corresponding compressed data streams. The compression ratio that is applied to each of the data streams varies as a function of the metrics determined in step 102. Note that the compression ratio for a particular data stream may not depend solely on the metrics determined for that particular data stream, but may also depend on the metrics determined for other data streams. For example, the metrics for all data streams may be ranked in order and the compression ratios determined accordingly. Therefore the compression ratio for a particular data stream may depend on the metrics for that data stream relative to the metrics for the other data streams. Further, if one or more of the data streams is absent, that may also affect the compression ratios applied to other data streams.

In step 106, the compressed data streams are stored in the buffer 16, for example, in the manner described above. That is, a write address pointer points to a particular address in the memory buffer and data is written to that address. A read address pointer points to an earlier address in the buffer to allow the data at that address to be read and used by the electronic device in which the device 10 is located.

Figure 5:
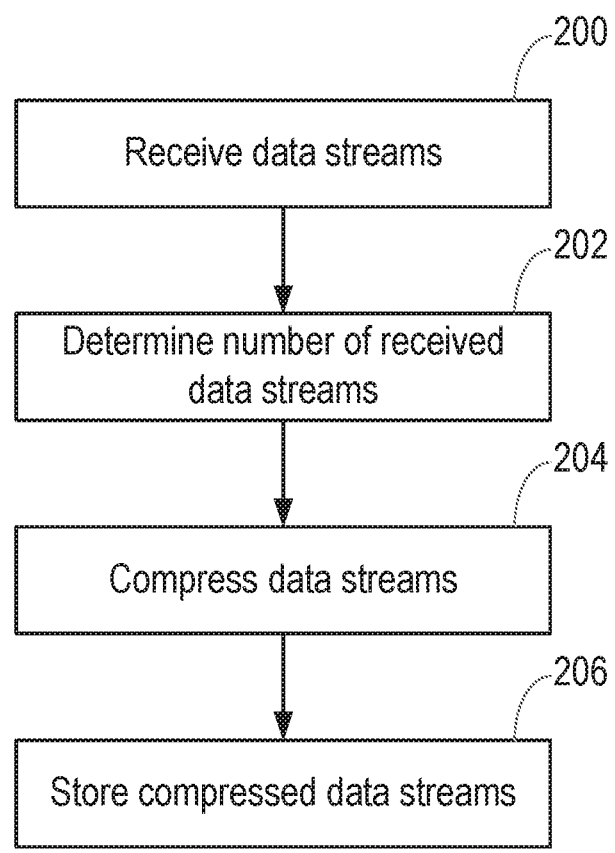
FIG. 5 is a flowchart of another method according to embodiments of the invention.

FIG. 5 is a flowchart of a related method according to embodiments of the invention.

In step 200, one or more data signals are received on the plurality of inputs 12. As noted above, the data signals may be digital data streams, or analogue data signals (in which case they are converted to digital data streams in ADC circuitry). Further, it is apparent that data signals may not be received on all of the inputs 12, for example, if one or more of the sensors (e.g. microphones) is deactivated or develops a fault. Therefore one or more data signals are received on the plurality of inputs 12. If all of the sensors are active, the data signals may be received on all of the inputs 12.

In step 202, the allocation module 18 and its associated quality measure module 20 determines the number of received data signals. As noted above, the number of received data signals may be less than the number of inputs 12 (or the number of sensors) if one or more of those sensors is deactivated or faulty. The allocation module 18 and its associated quality measure module 20 may determine one or more additional metrics for each of the data streams as well.

In step 204, the compression module 14 compresses each of the data streams to produce corresponding compressed data streams. The compression ratio that is applied to each of the data streams varies as a function of the number of received data signals determined in step 202. For example, the compression ratio may be the same for all received data signals, such that the available space in the buffer memory is equally shared between received data signals. Alternatively, particularly when the additional metrics determined in step 202 are taken into account, the compression ratio may vary as between each of the data streams. For example, data streams with relatively better or preferred metrics may be allocated relatively more of the available memory space.

In step 206, the compressed data streams are stored in the buffer 16, for example, in the manner described above. That is, a write address pointer points to a particular address in the memory buffer and data is written to that address. A read address pointer points to an earlier address in the buffer to allow the data at that address to be read and used by the electronic device in which the device 10 is located.

Figure 6:
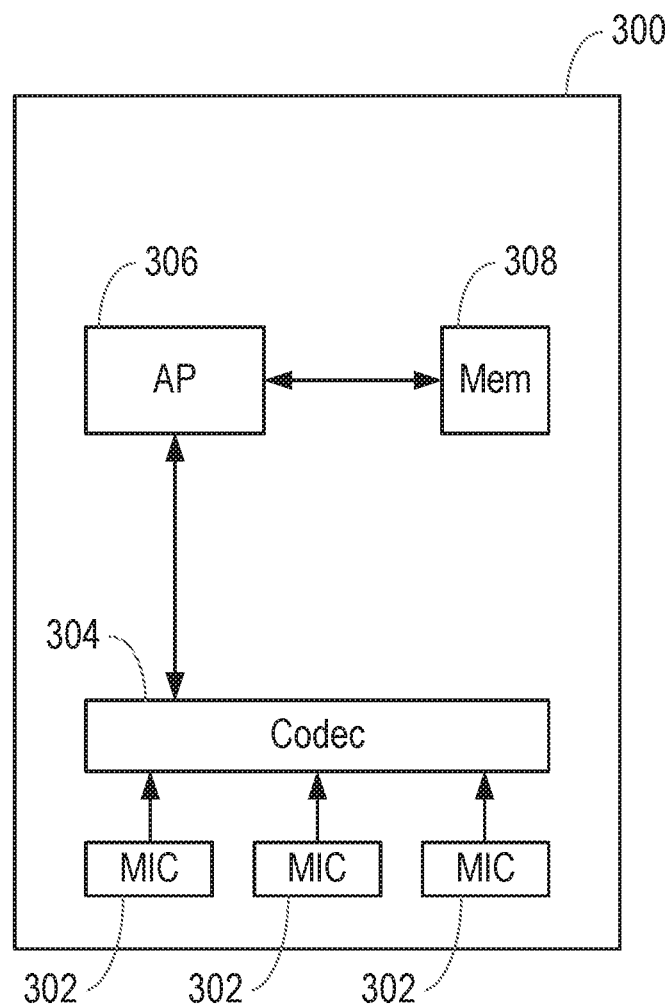
FIG. 6 shows an electronic device according to embodiments of the invention.

FIG. 6 shows an electronic device 300 according to embodiments of the invention.

For example, the electronic device 300 may be a portable device; a battery powered device; a communications device; a computing device; a mobile telephone; a laptop, notebook or tablet computer; a personal media player; a gaming device; and/or a wearable device.

The electronic device 300 comprises a plurality of microphones 302. In the illustrated embodiment there are three microphones (MIC1-MIC3) but any number of microphones greater than or equal to two may be employed. For example, one or more of the microphones may be employed primarily to detect a voice of a user of the electronic device 300. For example, if the device 300 is a telephone, it will typically have a voice microphone positioned at one end to detect the user's voice. One or more of the other microphones 302 may be provided to detect background, i.e. ambient, noise in the vicinity of the device 300, such as may be used, for example, in active noise cancellation techniques so as to reduce the noise that would otherwise be heard by a user of the device 300, or to improve the signal-to-noise ratio (SNR) in the signal detected by the voice microphone.

Each of the transducers, i.e. microphones, 302 is coupled to a codec circuit 304 in which the device 10 described above may be employed. The codec circuit 304 may be provided on a standalone, single chip, or as part of a chip providing multiple functions.

Thus the microphones 302 are coupled to the inputs 12, and the various techniques discussed above may be employed to buffer, i.e. store, the data signals provided by the microphones 302 to the codec 304. The codec 304 will typically provide further functionality, i.e. signal processing, to improve the quality of the signals stored in the buffer 16 (e.g. through audio enhancement techniques such as beamforming, etc), before the processed audio data is provided to other circuitry within the device 300, such as an applications processor (AP) 306 and/or long-term memory (Mem) 308. The further processing of the data is beyond the scope of this disclosure.

In one embodiment, therefore, the sensors are microphones and the data streams thus represent audio data streams. However, the disclosure is not limited in this respect and those skilled in the art will appreciate that the methods and apparatus disclosed herein are also useful in compressing and buffering data received from alternative sources. For example, the sensors may comprise one or more of any of the following non-exhaustive list (with corresponding data types): imaging, cameras, light sensors, antennae, bio-sensors, medical sensors, temperature sensors, humidity sensors and/or pressure sensors including combinations thereof.

Embodiments of the invention thus provide methods and apparatus for the intelligent, i.e. considered, compression and buffering of data signals received from a plurality of sensors. By taking into account metrics or characteristics of the received data, the compression ratio applied to each data stream can be varied to maximize the efficiency with which buffer memory is stored. Thus a greater amount of relevant data can be stored in a given size of buffer, or the buffer itself can be reduced in size.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in an electronic device, especially a portable and/or battery powered electronic device such as a mobile telephone, an audio player, a video player, a PDA, a mobile computing platform such as a laptop computer or tablet and/or a games device for example.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

Terms such as amplify or gain include possibly applying a scaling factor of less than unity to a signal.

The invention claimed is:

1. A device, comprising:
an allocation module, for determining one or more metrics of each of a plurality of data streams;
a compression module, for compressing each of the plurality of data streams and generating a plurality of compressed data streams, the compression module applying a compression ratio that varies as a function of the metrics determined by the allocation module; and
a buffer memory, for storing the plurality of compressed data streams, wherein the buffer memory comprises Y rows, each row being X bits wide, wherein X and Y are integers, and wherein data values stored in each row correspond to samples of said plurality of data streams acquired at an instance in time, wherein the compression ratios for each of the plurality of data streams are selected such that a row of the buffer memory is fully occupied with samples of said plurality of data streams acquired at an instance in time.

2. The device according to claim 1, wherein the compression ratio for each of the plurality of data streams at an instance in time is the same.

3. The device according to claim 1, wherein the compression ratio for a first data stream of the plurality of data streams is different to a compression ratio for a second data stream of the plurality of data streams at an instance in time.

4. The device according to claim 1, wherein the compression module is configured to update a compression ratio for each of the plurality of data streams at a frequency that is lower than a sampling frequency of the plurality of data streams.

5. The device according to claim 4, wherein the compression module is configured to select a compression ratio for each of the plurality of data streams every nth sample of the plurality of data streams, wherein n is an integer greater than one.

6. The device according to claim 1, wherein a power level provided to the buffer memory varies as a function of the one or more metrics.

7. The device according to claim 6, wherein respective power levels are provided to respective portions of the buffer memory, and wherein the respective power levels vary as a function of the metric associated with the compressed data stream stored in the respective portions of the buffer memory.

8. The device according to claim 1, wherein the one or more metrics determined for each of the plurality of data streams comprise whether the data stream is active or not.

9. The device according to claim 8, wherein the compression module is configured to select a compression ratio for each of the active data streams as a function of the number of active data streams.

10. The device according to claim 1, wherein the one or more metrics determined for each of the plurality of data streams comprise a quality of the data contained in the data stream.

11. The device according to claim 10, wherein the compression module is configured to select a higher compression ratio for a data stream having lower-quality data than for a data stream having higher-quality data.

12. The device according to claim 1, wherein the one or more metrics determined for each of the plurality of data streams comprise one or more of: a number of power levels in the data stream; activity of the data stream; amplitude of the data stream; the bandwidth of the data stream; the signal-to-noise ratio (SNR) of the data stream; the sparsity of the data stream; the importance of the data stream; the sampling frequency of the data stream; and the dominant frequency of the data stream.

13. The device according to claim 12, wherein the compression module is configured to select a higher compression ratio for a data stream having fewer power levels than for a data stream having relatively more power levels.

14. The device according to claim 1, wherein the sensors are microphones, and wherein the data streams are audio data streams.

15. An electronic device comprising a device as claimed in claim 1.

16. The electronic device as claimed in claim 15, further comprising a plurality of sensors coupled to the device.

17. The electronic device as claimed in claim 16, wherein the plurality of sensors comprise a plurality of microphones.

18. A device, comprising:
   a plurality of inputs, for receiving one or more data signals from a plurality of sensors;
   an allocation module, for determining a number of received data signals;
   a compression module, for compressing data streams corresponding to each of the received data signals and generating one or more compressed data streams, the compression module applying a compression ratio that varies as a function of the number of received data signals; and
   a buffer memory, for storing the one or more compressed data streams, wherein the buffer memory comprises Y rows, each row being X bits wide, wherein X and Y are integers, wherein data values stored in each row correspond to samples of said one or more received data signals acquired at an instance in time, and wherein the compression module is arranged to select a compression ratio for each of the one or more compressed data streams such that each of the rows of the buffer memory is fully occupied with data values corresponding to samples of the one or more compressed data streams acquired at an instance in time.

19. The device according to claim 18, wherein the allocation module is further for determining one or more additional metrics of the one or more received data signals, and wherein the compression ratio also varies as a function of the one or more additional metrics.

20. The device according to claim 18, wherein the compression ratio for each of the one or more data streams at an instance in time is the same.

21. The device according to claim 18, wherein the plurality of inputs receive a plurality of data signals, wherein the compression ratio for a first data stream of the plurality of data streams is different to a compression ratio for a second data stream of the plurality of data streams at an instance in time.

22. The device according to claim 18, wherein the sensors are microphones, and wherein the data streams are audio data streams.

23. An electronic device comprising a device as claimed in claim 18.

* * * * *